United States Patent [19]

Shibata

[11] Patent Number: 5,023,679
[45] Date of Patent: Jun. 11, 1991

[54] SEMICONDUCTOR DEVICE
[75] Inventor: Hideki Shibata, Yokohama, Japan
[73] Assignee: Kabushiki Kaisha Toshiba, Kawasaki, Japan
[21] Appl. No.: 372,462
[22] Filed: Jun. 28, 1989
[30] Foreign Application Priority Data Jun. 30, 1988 [JP] Japan ............................ 63-160779

[51] Int. Cl.⁵ .................. H01L 29/78; H01L 29/100; H01L 29/040
[52] U.S. Cl. ................................ 357/23.4; 357/23.1; 357/59
[58] Field of Search ................. 357/23.1, 23.4, 59 G, 357/59 I, 23.3, 67 S, 71 S, 71 P, 67, 71

[56] References Cited

U.S. PATENT DOCUMENTS 4,700,215 10/1987 McPherson ........................... 357/71
4,807,013 2/1989 Monocha .............................. 357/59

FOREIGN PATENT DOCUMENTS 0134072 6/1986 Japan ................................. 357/23.1
0293772 12/1987 Japan ................................. 357/23.1
0168050 7/1988 Japan ................................. 357/23.3
0217664 9/1988 Japan ................................. 357/23.3
0227059 9/1988 Japan ................................. 357/23.3

OTHER PUBLICATIONS

Huang et al., "A Novel Submicron LDD Transistor with Inverse-T Gate Structure," Technical Digest of IEDM, pp. 742-745, 1986.

Primary Examiner—Rolf Hille
Assistant Examiner—Peter Toby Brown
Attorney, Agent, or Firm—Finnegan, Henderson, Farabow, Garrett and Dunner

[57] ABSTRACT

A semiconductor device comprises a MOSFET of LDD structure, in which the gate electrode structure comprises an oxide film interposed between a poly-Si layer and a refractory metal layer or a metal silicide. The oxide film prevents the metal or metal silicide from being diffused into the gate oxide film during the heating step included in the process of manufacturing the semiconductor device. Also, a side wall spacer is formed of poly-Si to achieve an electrical connection between the poly-Si layer and the layer of the metal having a high melting point or of the metal silicide so as to constitute a part of the gate electrode.

4 Claims, 2 Drawing Sheets

SEMICONDUCTOR DEVICE

BACKGROUND OF THE INVENTION

1. Field of the Invention

The present invention relates to a semiconductor device including a MOSFET of an LDD (Lightly Doped Drain) structure, particularly, to a semiconductor device including a MOSFET of an LDD structure of a so-called "polycide gate electrode", which comprises a poly-Si layer and a refractory metal such as W, Ti or Ta or a metal silicide layer, and a method of manufacturing the same.

2. Description of the Related Art

FIG. 1 shows the conventional NMOSFET of an LDD structure. For manufacturing the MOSFET shown in the drawing, a gate oxide film 2 is deposited first on a p-type semiconductor substrate 1, followed by forming a poly-Si layer 3 on the gate oxide film 2. Then, As ions are implanted, followed by activating the implanted As ions by heat treatment and subsequently forming a metal silicide layer 4. Further, an anisotropic etching is applied so as to form a gate electrode structure. Then, impurity ions are implanted at a low concentration to form a diffusion layer 6 for the LDD structure, followed by forming a $SiO_2$ layer by CVD. Further, anisotropic etching is applied to the CVD $SiO_2$ layer so as to form a sidewall spacer 5 for the gate electrode, followed by ion implantation for forming source/drain regions 7. The problems summarized below are inherent in the conventional MOSFET shown in FIG. 1:

1. A heat treatment such as annealing is applied to a laminate structure consisting of the poly-Si 3 and the metal silicide layer 4 having a high melting point. During the heat treatment, the metal atoms within the metal silicide layer 4 are diffused into the gate oxide film 2 through the grain boundary within the poly-Si layer 3 so as to lower the breakdown voltage of the gate oxide film 2. The problem is serious in the case where the poly-Si layer 3 is made thin, leading to a serious defect in the case of flattening the surface morphology for miniaturizing the elements.

2. The LDD structure is effective for moderating the electric field around the drain region so as to improve the reliability of the MOSFET. In the conventional method in which the sidewall spacer 5 is formed of $CVD.SiO_2$, hot electrons derived from stress are trapped in the $CVD.SiO_2$ layer 5 positioned on the $N^-$ type region, leading to a high resistance at the boundary between the $CVD.SiO_2$ layer 5 and the diffusion layer 6. This brings about the deterioration inherent in the LDD structure.

SUMMARY OF THE INVENTION

The present invention, which has been achieved in view of the situation described above, is intended to provide a method of reliably manufacturing a semiconductor device comprising a MOSFET of LDD structure using a gate electrode including a refractory metal or a metal silicide layer.

Another object is to provide a semiconductor device which permits thinning the gate electrode and a method of manufacturing the same.

Still another object is to provide a method of manufacturing a semiconductor device, which permits preventing the atoms of a refractory metal or of a metal silicide from being diffused into the gate oxide film through a poly-Si layer during the heat treatment in the manufacturing process so as to prevent deterioration of the gate oxide film.

A method of the present invention is directed to the manufacture of a MOSFET of LDD structure of polycide type having a layer of a refractory metal or a metal silicide layer, and comprises the steps of depositing a first poly-Si layer on the active element region of an element-separated semiconductor substrate with a gate oxide film interposed therebetween; doping the poly-Si layer with an N-type impurity for stabilizing the work function; depositing a refractory metal or a metal silicide layer on the first poly-Si layer; forming a gate electrode structure by anisotropic etching; implanting impurity ions for forming a diffusion layer of a low impurity concentration; depositing a second poly-Si layer; doping the second poly-Si layer with an impurity; applying anisotropic etching to permit the second poly-Si layer to remain on only the side walls of the first poly-Si layer and the refractory metal layer or metal silicide layer; and applying an ion implantation for forming the source/drain region.

In the semiconductor device of the present invention, an oxide film is interposed, as required, between the poly-Si layer and the refractory metal layer or metal silicide layer included in the gate electrode structure. The presence of the oxide film serves to prevent the metal atoms in the refractory metal or the metal silicide layer from being diffused into the gate oxide film through the grain boundary of the poly-Si layer during the heating step included in the manufacturing process of the semiconductor device, with the result that the breakdown voltage of the gate oxide film is not lowered.

It should also be noted that the sidewall spacer 9 positioned on the low impurity diffusion layer is formed of poly-Si in the present invention in place of $CVD.SiO_2$ used in the conventional technique. Thus, in the present invention, the sidewall spacer is electrically connected to the refractory metal or the metal silicide layer acting as a gate electrode so as to form a part of the gate electrode. It follows that the present invention makes it possible to prevent the initial deterioration inherent in the LDD structure, which is brought about by the trapping of hot electrons caused by stress in the sidewall spacer of the $CVD.SiO_2$ layer formed in the conventional method on the low impurity diffusion layer.

DETAILED DESCRIPTION OF THE PREFERRED EMBODIMENT

Figure 2D:
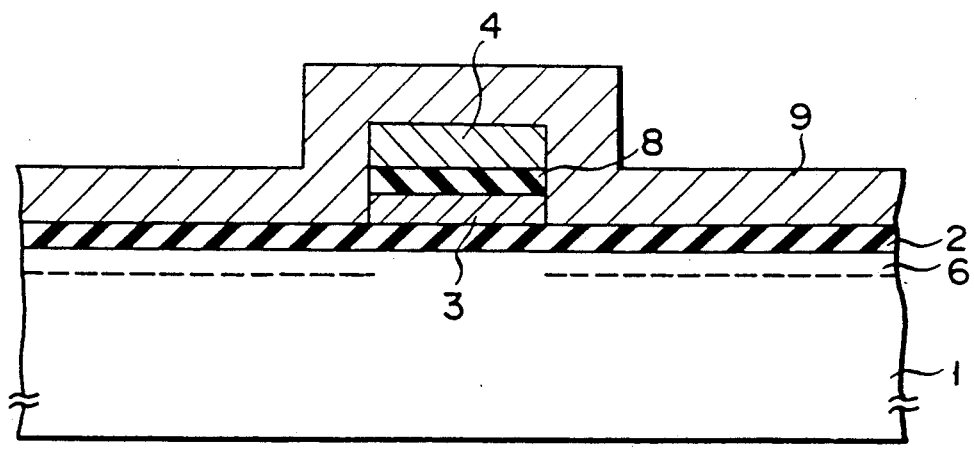
FIGS. 2A to 2E are cross sectional views collectively showing a method of manufacturing a semiconductor device according to one embodiment of the present invention.
Figure 2E:
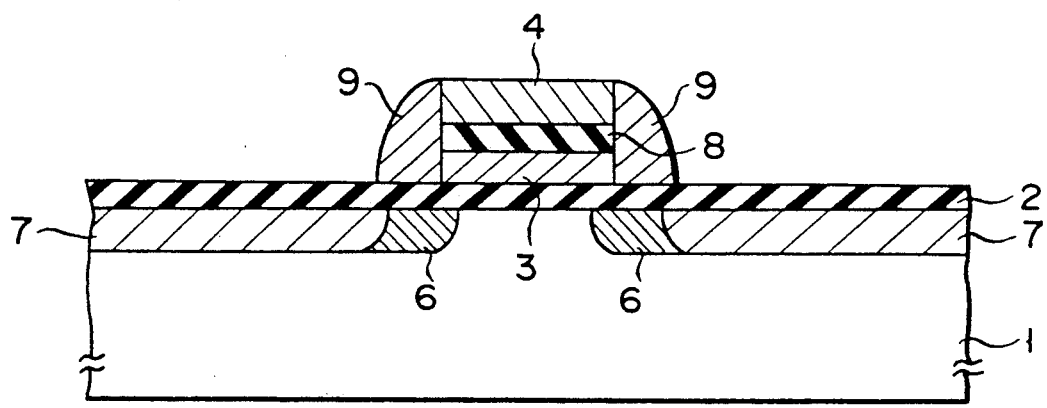
Figure 2A:
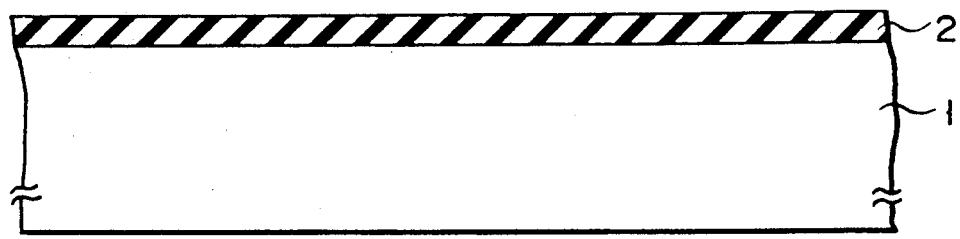
Figure 2B:
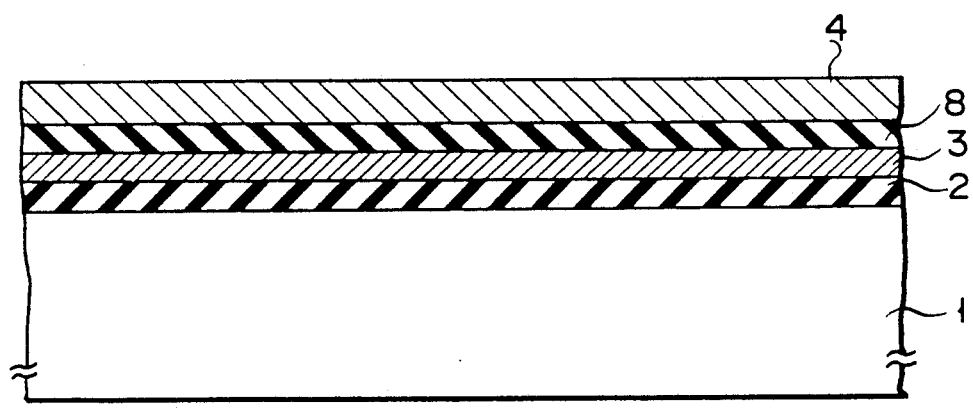

FIGS. 2A to 2E collectively show how to manufacture a semiconductor device according to one embodiment of the present invention. As shown in FIG. 2A, a gate oxide film 2 (first insulation film) is formed in a thickness of 100 to 120 Å using a 10% HCl solution at 800° C. on a P-type semiconductor substrate 1 (or on a P-well region after element separation), followed by boron ion implantation for controlling the threshold voltage $V_{TH}$. In the next step, a first poly-Si layer 3 (first conductor layer) is deposited in a thickness of 1500 Å, as shown in FIG. 2B, followed by implanting arsenic ions under an accelerating energy of 30 KeV and in a concentration of $5 \times 10^{15}$ cm$^{-2}$ so as to stabilize the work function. Then, the poly-Si layer 3 is oxidized under an oxidizing atmosphere at 850° C. in a thickness of 300 to 500 Å so as to form an oxide film 8 (second insulation film) which is to be interposed between the poly-Si layer and a refractory metal layer or a metal silicide layer. During the heat treatment for forming the oxide film 8, the arsenic ions implanted in the preceding step are activated. After formation of the oxide film, a metal silicide layer 4 (second conductor layer), e.g., a TiSi$_2$ layer, is formed by sputtering in a thickness of 2000 Å. The metal silicide layer 4, which acts as a gate electrode, may be replaced by a refractory metal layer.

Figure 2C:
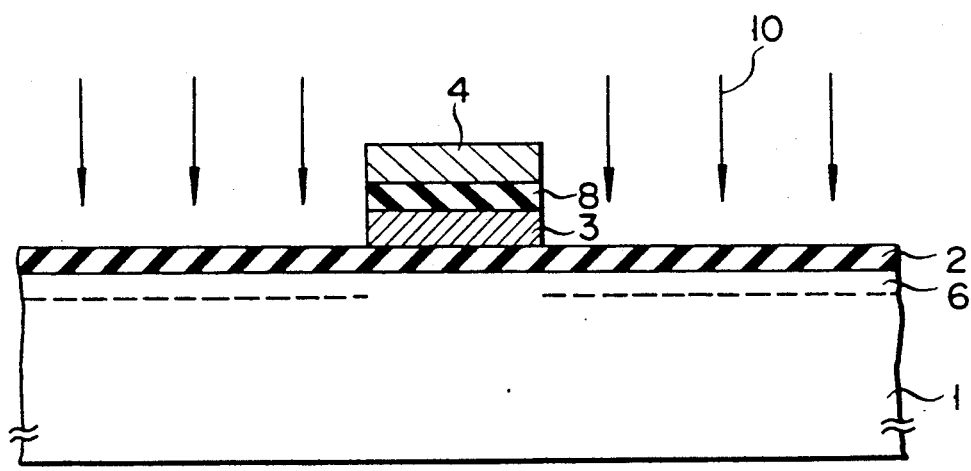

In the next step, a gate electrode structure is formed by means of anisotropic etching as shown in FIG. 2C. To be more specific, the metal silicide layer 4 is selectively etched first, followed by selectively removing the oxide film 8 and subsequently etching selectively the poly-Si layer 3. The two-stage etching employed in the present invention permits suppressing the damage done to the oxide film 2 formed on the semiconductor substrate 1 in terms of the etching rate, compared with the selective removal of the metal silicide layer 4, oxide film 8 and the poly-Si layer 3 by a single stage etching. After formation of the gate electrode structure, phosphorus ions are implanted at a dose of $4 \times 10^{13}$ to $1 \times 10^{14}$ cm$^{-2}$ under an accelerating energy of 60 KeV to 100 KeV for forming an LDD N$^-$ structure. Further, a second poly-Si layer 9 is deposited in a thickness of 1000 Å, as shown in FIG. 2D, followed by N-type doping by means of the POCl$_3$ diffusion method.

Further, anisotropic etching is applied to the poly-Si layer 9 to form a sidewall spacer consisting of poly-Si to cover the sidewalls of the poly-Si layer 3, oxide film 8 and the metal silicide layer 4, as shown in FIG. 2E. Finally, arsenic ions are implanted under an accelerating energy of 40 KeV to 60 KeV at a dose of $5 \times 10^{15}$ cm$^{-2}$ for forming source and drain regions so as to manufacture an NMOSFET of LDD structure comprising the second diffusion layer 6 formed by an impurity diffusion at a low concentration and the first diffusion layer 7 formed by an impurity diffusion at a high concentration.

In the case of a PMOSFET of LDD structure, B or BF$_2$ ions are implanted for forming the source/drain regions. In the case of a PMOSFET of surface channel type, a p-type impurity is doped after deposition of the first poly-Si layer.

In the embodiment shown in the drawings, the second layer is formed of a metal silicide. However, it is also possible to use a refractory metal such as tungsten, tantalum or titanium for forming the second conductor layer.

Figure 1:
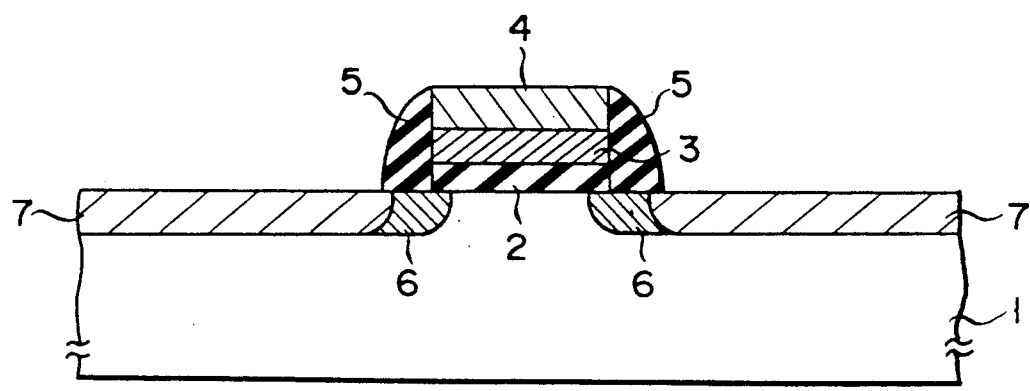
FIG. 1 is a cross sectional view showing a semiconductor device manufactured by the conventional method.

In the embodiment described above, the oxide layer 8 interposed between the metal silicide layer 4 and the poly-Si layer 3 acts as a barrier inhibiting the impurity diffusion so as to prevent the problem inherent in the prior art, i.e., a lowered breakdown voltage of the gate oxide film 2. It should also be noted that the sidewall spacer 9 positioned above the LDD N$^-$ region is formed of poly-Si and is electrically connected to the metal silicide layer 4 and to the poly-Si layer 3 so as to constitute a part of the gate electrode. The particular construction is effective for suppressing the initial deterioration inherent in the LDD structure. What should also be noted is that the presence of the oxide film 8 makes it possible to reduce the thickness of the poly-Si layer to about 500 Å or less from about 2000 Å in the conventional semiconductor device shown in FIG. 1.

What is claimed is:

1. A semiconductor device, comprising:
   a semiconductor substrate of a first conductivity type;
   a source/drain diffusion layer of a second conductivity type in the surface region of the semiconductor substrate, said source/drain diffusion layer including a first diffusion layer of a high impurity concentration and a second diffusion layer of a low impurity concentration;
   a first insulation film formed on the semiconductor substrate;
   a gate electrode formed on the first insulating film, said gate electrode including;
   a first conductor layer having a thickness of about 500Å or less formed on the first insulation film,
   a second insulation film formed on the first conductor layer, and
   a second conductor layer formed on the second insulation film,
   the first and second conductor layers and the insulation film defining a sidewall surface,
   a sidewall spacer including a third conductor layer formed on the sidewall surface for maintaining an electrical connection between the first conductor layer and the second conductor layer.

2. The semiconductor device according to claim 1, wherein the second conductor layer is formed of a material selected from the group consisting of refractory metals and metal silicides.

3. A semiconductor device, comprising:
   a semiconductor substrate of a first conductivity type;
   a source/drain diffusion layer of a second conductivity type formed in the surface region of the semiconductor substrate, said source/drain diffusion layer including a first diffusion layer of a high impurity concentration and a second diffusion layer of a low impurity concentration;
   a first insulation film formed on the semiconductor substrate;
   a gate electrode formed on the first insulation film, said gate electrode including;
   a first conductor layer having a thickness of about 500Å or less formed on the first insulation film,
   a second insulation film formed on said first conductor layer,
   a second conductor layer formed on said second insulation film,
   the first and second conductor layer defining a sidewall surface,
   a sidewall spacer, including a polysilicon film doped with an impurity, formed on the sidewall surface, and a bottom surface of said sidewall spacer partially overlying the second diffusion layer with the first insulation film interposed therebetween.

4. The semiconductor device according to claim 3, wherein the second conductor layer is formed of a material selected from the group consisting of refractory metals and metal silicides.

* * * * *